US008653897B2

(12) United States Patent
Shanfield et al.

(10) Patent No.: US 8,653,897 B2
(45) Date of Patent: Feb. 18, 2014

(54) DEVICES, SYSTEMS, AND METHODS FOR CONTROLLING THE TEMPERATURE OF RESONANT ELEMENTS

(75) Inventors: Stanley R. Shanfield, Newton, MA (US); Thomas A. Langdo, Cambridge, MA (US); Marc S. Weinberg, Needham, MA (US); Albert C. Imhoff, Boxford, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 3 days.

(21) Appl. No.: 13/567,915

(22) Filed: Aug. 6, 2012

(65) Prior Publication Data

US 2012/0299662 A1  Nov. 29, 2012

Related U.S. Application Data

(62) Division of application No. 12/768,501, filed on Apr. 27, 2010, now Pat. No. 8,248,173.

(51) Int. Cl.
*H03B 1/02* (2006.01)
*H03B 5/32* (2006.01)

(52) U.S. Cl.
USPC ............................... 331/69; 331/70; 331/158

(58) Field of Classification Search
USPC .......... 331/66, 68, 69, 70, 158, 341, 343, 344
See application file for complete search history.

(56) References Cited

U.S. PATENT DOCUMENTS

| 3,155,157 A | 11/1964 | Anderson et al. |
| 3,169,378 A | 2/1965 | Taylor |
| 4,362,023 A | 12/1982 | Falco |
| 5,228,923 A | 7/1993 | Hed |
| 5,385,022 A | 1/1995 | Kornblit |
| 5,411,599 A | 5/1995 | Horn et al. |
| 5,488,333 A | 1/1996 | Vig |
| 5,659,270 A | 8/1997 | Millen et al. |
| 5,834,828 A | 11/1998 | Horn et al. |
| 5,936,192 A | 8/1999 | Tauchi |
| 6,509,520 B1 | 1/2003 | Kyle et al. |
| 6,588,217 B2 | 7/2003 | Ghoshal |
| 6,621,361 B1 | 9/2003 | Fry |
| 6,859,110 B2 | 2/2005 | Satoh |

(Continued)

FOREIGN PATENT DOCUMENTS

| JP | 06188342 A | 7/1994 |
| JP | 2003069422 A | 3/2003 |
| JP | 2007097036 A | 4/2007 |
| WO | WO 9411763 A1 * | 5/1994 |

OTHER PUBLICATIONS

Bail "EMXOs Boost Oscillator Performance with Lower Power Consumption and Reduced Size", RF Design, Time and Frequency, Sep. 2007, pp. 18-26.

(Continued)

*Primary Examiner* — Ryan Johnson
(74) *Attorney, Agent, or Firm* — Sunstein Kann Murphy & Timbers, LLP

(57) ABSTRACT

A thermoelectric device transfers heat away from or toward an object using the Peltier effect. In some embodiments, the length of at least one thermoelectric element is at least ten times greater than a combined average cross-sectional dimension, orthogonal to the length, of two thermoelectric elements.

10 Claims, 9 Drawing Sheets

(56) References Cited

U.S. PATENT DOCUMENTS

| | | |
|---|---|---|
| 7,143,499 B2 | 12/2006 | Seidel et al. |
| 7,173,499 B2 | 2/2007 | Satoh |
| 2009/0078298 A1 | 3/2009 | Weave, Jr. et al. |

OTHER PUBLICATIONS

Lerou et al. "Fabrication of a Micro Cryogenic Cold Stage Using MEMS-Technology," J. Micromech. Microeng, vol. 16, 2006, pp. 1919-1925.

Moran, "Multidisciplinary Analysis of a Microsystem Device for Thermal Control," Prepared for the 11th Thermal & Fluids Analysis Workshop, Cleveland, OH, 2000, pp. 173-186.

Vorokhovsky et al. "New Concepts of Internally Heated Quartz Resonators (IHQRs) and Appropriate OCXOs," Frequency Control Symposium and PDA Exhibition, 2001. Proceedings of the 2001 IEEE International, 2001, pp. 778-780.

Watson et al. "Investigating GPS Signals Indoors with Extreme High-Sensitivity Detection Techniques," Navigation, vol. 52, No. 4, Winter 2005-2006.

\* cited by examiner

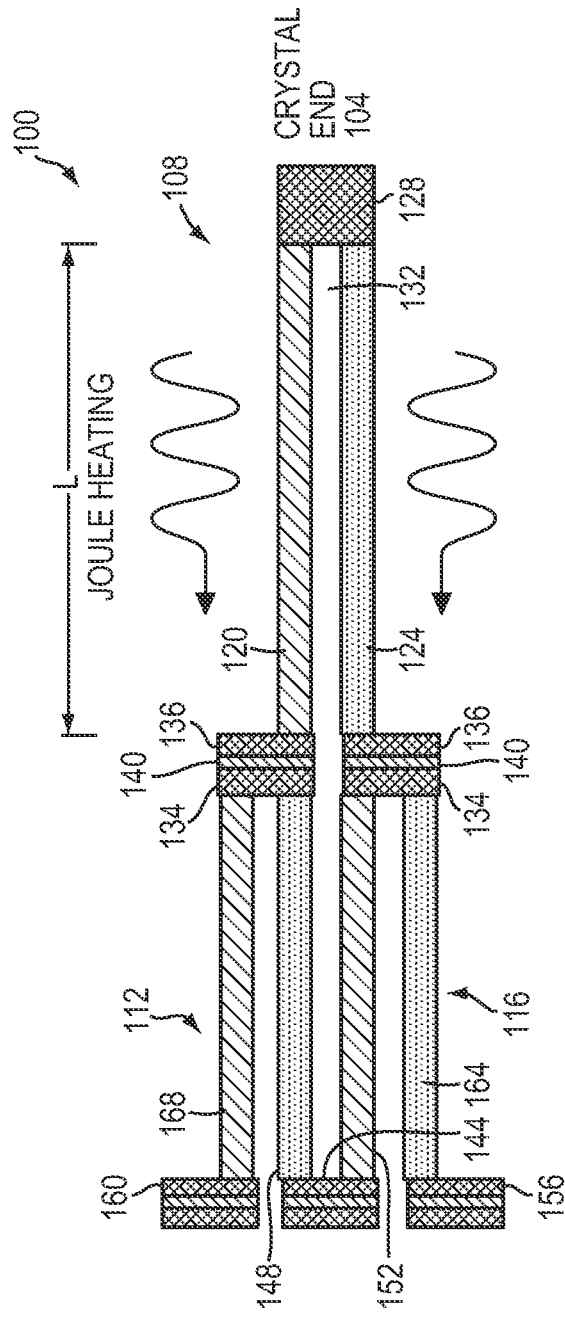
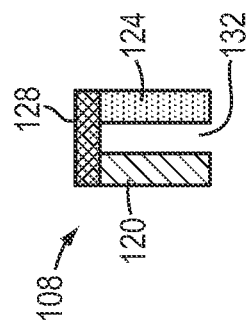

DEVICES, SYSTEMS, AND METHODS FOR CONTROLLING THE TEMPERATURE OF RESONANT ELEMENTS

CROSS-REFERENCE TO RELATED APPLICATION

This application is a divisional of, claims priority to and the benefit of, and incorporates herein by reference in its entirety U.S. patent application Ser. No. 12/768,501, which was filed on Apr. 27, 2010 and issued on Aug. 21, 2012 as U.S. Pat. No. 8,248,173.

TECHNICAL FIELD

In various embodiments, the present invention relates to devices, systems, and methods for controlling the temperature of resonant elements.

BACKGROUND

It is often difficult to acquire a global positioning system ("GPS") signal, even with a high-quality receiver and antenna, in very low (i.e., "deep fade") signal environments, such as in urban canyons, underground, and inside steel-reinforced buildings. In the limited situations where a GPS signal can be acquired indoors (e.g., away from steel structures and near windows), far more electrical energy is typically required to acquire the signal and calculate position than is required for "blue sky" conditions, and positional accuracy can be compromised.

Certain algorithmic approaches have been implemented to improve receiver acquisition performance under deep fade conditions, but the improvements are generally limited. There can be many reasons for acquisition and correlation failure on the receiver side in deep fade conditions. The acquisition capability in a well-designed system using high-quality detection algorithms is, however, typically limited by the frequency drift and phase noise generated by the receiver's local oscillator. The uncertainty caused by the local oscillator frequency and phase translates into a receiver bit-error rate, degrading the correlation strength of the coded signal. For weaker satellite signals, the acquisition fails, or a repeatable correlation cannot be found and large position errors are introduced.

In general, phase noise can be viewed as random thermal noise or temperature drift in a resonant element that is converted to random phase shifts or frequency drifts in oscillator output. Very low frequency phase noise (i.e., less than approximately 1 Hz) is usually labeled "frequency drift," and temperature change in the resonant element is the most significant cause of this frequency drift. For example, if the resonant element is a quartz crystal, rapid thermal fluctuations in the crystal lattice displacement amplitude create rapid phase fluctuations. Thermal fluctuation noise that occurs at harmonics of the resonator oscillation frequency contributes most strongly to the higher frequency phase noise. If the quartz crystal temperature is also slowly changing during operation, the resonant frequency will gradually change, introducing frequency drift.

There has, in general, been little progress with work done on systematic high frequency phase-noise reduction in frequency sources appropriate for portable, small, and low-power applications, such as GPS systems. However, some progress has been made with reducing frequency drift (i.e., low frequency phase noise) in frequency sources for portable receivers. In most high performance GPS systems, quartz crystal-based oscillators called "Temperature Controlled Crystal Oscillators" (TCXOs) use lumped circuit elements to partially compensate for temperature-induced resonant frequency drift in the crystal. The typical TCXO shows about $\frac{1}{10}^{th}$ the frequency change of an uncompensated crystal over a typical operating temperature range. "Oven-Controlled Crystal Oscillators" (OCXOs) employ physical temperature control of the resonator, and they generally reduce the temperature-variation-induced frequency drift even more than TCXOs. The typical OCXO has from $\frac{1}{10}^{th}$ to $\frac{1}{100}^{th}$ the frequency change of a TCXO over a typical operation temperature range.

A battery-powered GPS receiver can be enhanced with a very stable, low frequency drift local-oscillator frequency source. With precise knowledge of time derived from the stable source, the Doppler shift in satellite transmitter frequency may be accurately determined from ephemeris (orbit) data. Consequently, the frequency search space needed to acquire the GPS signal is sharply reduced, leading to significant savings in battery energy. Then, after acquisition is achieved, minimal frequency drift in the local oscillator frequency source during satellite data collection also allows for more rapid and accurate determination of receiver position. This again saves battery energy.

Stable frequency sources also benefit most battery-powered infil digital receivers and exfil transmitters and beacons. For example, the position of a fixed-beacon transmitter deduced by Doppler shift in a passing aircraft typically requires a collection time of seconds to minutes. Consequently, the frequency of the transmitted signal must be stable on this time scale to maintain beacon location accuracy.

In general, conventional OCXOs offer the necessary level of frequency stability, but they generally require relatively high average power, particularly at low environmental temperatures. Moreover, since the OCXO must generally operate at all times, the battery requirements for operating over extended periods of time become prohibitive.

Conventional OCXOs require high average power because of the way in which they are operated. Their crystals (usually quartz) are typically maintained at a temperature of 15° C. to 20° C. higher than the highest temperature rating of the transmitter or receiver unit. Resistive heating elements have been assumed to offer the best combination of low cost and minimum size, so the crystal temperature must be maintained above the highest specified ambient temperature. Since the specified upper range of operating temperature in many applications can be as high as 70° C., the crystal operating temperature is often set at 90° C. or higher. The high crystal operating temperature of the OCXO also requires that the resonant frequency of the crystal stabilize when the OCXO is first powered "on," i.e., if the OCXO is activated from room temperature in an effort to save power between uses, the temperature and strain fields must generally be allowed to thermally stabilize at the high operating temperature before the resonant frequency is fully stabilized. This stabilization time can be on the order of several minutes, an unacceptably long waiting period for many applications.

A higher-than-ambient-temperature crystal, as used in a conventional OCXO, implies high heat transfer and high continuous energy loss to the environment. This loss may be mitigated by using thermal insulation. However, in applications where the size of the crystal unit is critical, a significant volume of thermal insulation is unacceptable. Consequently, OCXOs are almost never used in miniaturized portable receivers and transmitters where only battery power is available.

Reduced temperature has been shown to reduce high frequency (i.e., greater than approximately 1 Hz) phase noise in quartz, sapphire, and rubidium resonators. The temperature at which high frequency phase noise is reduced significantly depends on the practical details of the resonator material. For example, the level of contaminants and crystal defects in quartz will generally impact the temperature at which the high frequency phase noise is reduced. Cryogenic cooling systems, which are usually mechanical, are often used for cooling crystals in specialized receivers intended for receiving signals from deep-space probes, and this cooling is effective at reducing high frequency phase noise. However, such systems generally consume significant electrical power (i.e., many watts) and take up substantial volume (i.e., many cubic centimeters), which is generally unsuitable for portable, small, and low power applications, such as GPS systems.

Accordingly, needs exist for improved devices, systems, and methods of i) maintaining a constant resonant element temperature, and ii) reducing the temperature of the resonant elements used in portable, small, and low-power applications, such as GPS systems, so as to efficiently reduce frequency drift and higher frequency phase noise contributed by those resonant elements.

SUMMARY OF THE INVENTION

In various embodiments, the invention relates to devices, systems, and methods that significantly reduce frequency drift and the high frequency phase noise contributed by a crystal resonator used in an oscillator frequency reference. In particular, in certain embodiments, the phase noise limitation is reduced by: (i) stabilizing the temperature of the resonant crystal in the local oscillator without requiring significant power or increased physical volume, and (ii) reducing the temperature of the resonant crystal in the local oscillator without requiring significant power or increased physical volume. While temperature stabilization and resonator cooling are not new ideas for reducing frequency drift and high frequency phase noise, the embodiments described herein are ideal for portable, ultra-miniature (e.g., less than 0.5 cubic centimeter), and low power (e.g., a few milliwatts or less) systems.

In one embodiment, thermoelectric devices having very small cross sections are used to cool a tiny, thermally insulated reference-frequency crystal. Advantageously, as described below, the cooling arrays add little physical volume to the crystal resonator and also consume little power. In this way, they are particularly suitable for cooling the temperature of resonant elements used in portable, small, and low-power applications, such as GPS systems.

In other embodiments, the invention relates to devices, systems, and methods that stabilize the frequency sources used in such applications. For example, the temperature of the resonant element (e.g., a crystal oscillator) may be maintained at a likely environmental temperature (i.e., at a set temperature within the range of the environmental temperatures expected during its operation) by a combination of heating and cooling elements. Advantageously, with the fixed temperature of the crystal oscillator set at the likely environmental temperature, the amount of electrical energy required by the heating element is reduced, and a significant (i.e., more than 10-fold) power savings can be achieved in comparison to a conventional OCXO. Moreover, the size of this temperature-controlled oscillator system need not be appreciably larger than a typical TCXO, making it ideal for use in miniaturized versions of battery-powered transmitters and receivers that benefit from very stable frequency sources.

In general, in one aspect, embodiments of the invention feature a thermoelectric device that includes first and second elongate thermoelectric elements coupled to one another for transferring heat away from or toward an object using the Peltier effect. A length of at least one of the thermoelectric elements is at least ten times greater than a combined average cross-sectional dimension, orthogonal to the length, of the first and second thermoelectric elements when located side-by-side along their length. The thermoelectric device may be employed as a thermoelectric cooler. Alternatively, as described further below, by reversing the direction of current flow therein, the thermoelectric device may be employed as a thermoelectric heater.

In various embodiments, the first and second thermoelectric elements are partially spaced from one another by an insulator, such as air, a polymer, or a dielectric material. The first thermoelectric element may be a p-type semiconductor and the second thermoelectric element may be an n-type semiconductor. The p- and n-type semiconductors may include, for example, bismuth telluride or bismuth antimony telluride.

In general, in another aspect, embodiments of the invention feature a thermoelectric system. The system includes a resonant element and a first thermoelectric device of the type described above, which is thermally coupled to the resonant element. Optionally, one or more additional thermoelectric devices may be thermally coupled to the first thermoelectric device. For its part, the resonant element may be, for example, a crystal in a package, such as a quartz crystal, a sapphire crystal, or a rubidium crystal.

In one embodiment, the resonant element is employed in a local oscillator, such as in a local oscillator of a GPS receiver. A casing may hermetically seal the resonant element, and a housing may enclose the resonant element and the first/additional thermoelectric device(s). In one embodiment, a volume of the housing is less than 0.5 cubic centimeters. An aerogel, optionally coated with an infrared reflective layer, may be contained within the housing. Alternatively, or in addition, carbon dioxide may be contained within the housing. The carbon dioxide may be maintained at a pressure and temperature that lie on a solid-gas phase change line of a phase diagram for the carbon dioxide. This thermoelectric system may be, for example, a portable system, a handheld system, and/or a battery-powered system.

In general, in yet another aspect, embodiments of the invention feature a temperature-controlled oscillator system. The system includes a crystal oscillator, a casing sealing the crystal oscillator, a heater coupled to the casing for heating the crystal oscillator when an ambient temperature is below a set temperature threshold, and a cooler (separate from the heater) coupled to the casing for cooling the crystal oscillator when the ambient temperature is above the set temperature threshold.

The heater may be, for example, a resistive heater, while the cooler may be a thermoelectric device of the type described above. In one embodiment, both the heater and the cooler operate when the ambient temperature is approximately equal to the set temperature threshold. The system may also include a temperature sensor for measuring the ambient temperature.

In general, in still another aspect, embodiments of the invention feature a method for reducing high frequency phase noise in an output of a local oscillator. The method includes transferring, using the Peltier effect, heat away from a resonant element (e.g., a crystal) in the local oscillator via a thermoelectric device of the type described above.

In one embodiment, the method includes applying a potential difference between the first and second thermoelectric elements in order to activate the thermoelectric device. Doing so may consume, on average, less than 100 microwatts of power. Moreover, the potential difference may be applied just prior to acquiring a signal (e.g., a GPS signal) using the resonant element of the local oscillator, and may be removed after the signal has been collected. Applying the potential difference may cool the resonant element to a temperature of approximately 80° C. below the ambient temperature (e.g., to −60° C.).

In general, in a further aspect, embodiments of the invention feature a method for controlling a temperature of a crystal oscillator sealed within a casing. The method includes measuring an ambient temperature, heating the casing (and thereby the crystal oscillator) with a heater coupled to the casing when the ambient temperature is below a set temperature threshold, and cooling the casing (and thereby the crystal oscillator) with a cooler coupled to the casing separately from the heater when the ambient temperature is above the set temperature threshold.

The cooler may be a thermoelectric device of the type described above, and cooling the casing may include transferring, using the Peltier effect, heat away from the casing via the thermoelectric device. In one embodiment, the casing (and thereby the crystal oscillator) are both heated and cooled when the ambient temperature is approximately equal to the set temperature threshold.

These and other objects, along with advantages and features of the embodiments of the present invention herein disclosed, will become more apparent through reference to the following description, the accompanying drawings, and the claims. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 1A schematically illustrates a thermoelectric system in accordance with one embodiment of the invention;

FIG. 1B is a cross-sectional view of a single thermoelectric device in accordance with one embodiment of the invention;

DESCRIPTION

Figure 1C:
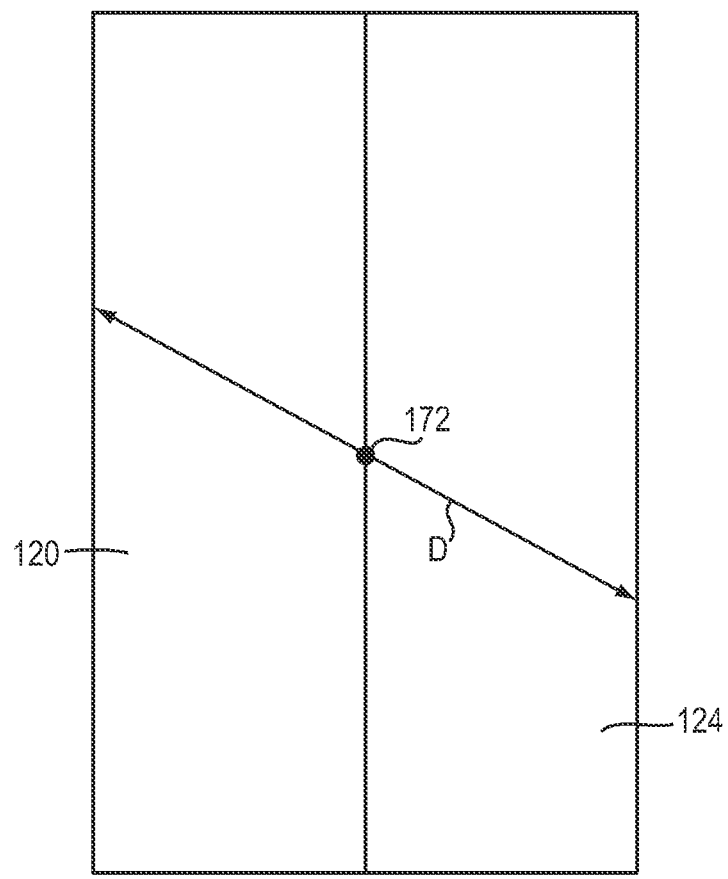
FIG. 1C is a cross-sectional view of two thermoelectric elements located side-by-side along their length in accordance with one embodiment of the invention.

In various embodiments, the present invention relates to devices, systems, and methods for controlling the temperature of resonant elements. In one embodiment, the temperature of a resonant crystal in a local oscillator is reduced significantly (e.g., to 80° C. below ambient temperature) so as to reduce the high-frequency phase noise contributed by the crystal resonator. This reduction in phase noise allows for longer coherent integration of received GPS satellite signals, thereby permitting acquisition and decoding at significantly lower signal levels. Instead of either the inability to acquire the GPS signal, or the incoherent addition of short coherent integrations performed in most GPS receivers, a single coherent integration is made possible. This single coherent integration has the added advantage of reducing the numerical processing time and power consumption for calculating a positional fix once acquisition has been obtained.

In another embodiment, the resonant crystal in the local oscillator is normally neither cooled or heated, but, rather, is allowed to assume the full range of environmental temperatures occurring during its operation. Just prior to the moment when stable output from the frequency source is required, however, a thermoelectric heating and cooling element is activated, and the crystal temperature is tightly controlled to an arbitrary temperature close to the ambient temperature. Generally, in this latter embodiment, high frequency phase noise persists, but the oscillation frequency of the resonant crystal is stabilized with much less power than is typically required in conventional super-stable frequency sources like OCXOs.

A. Reducing the High Frequency Phase Noise Contributed by a Crystal Resonator

Published phase noise data versus temperature for crystal resonators suggests that, in some cases, a temperature in the range of −60° C. reduces high frequency phase noise levels by more than 10 dB. Very-low-power thermoelectric cooling systems in accordance herewith can maintain a resonant element (e.g., a conventional quartz resonator) in a GPS local oscillator at about −60° C. In addition to the reduced phase noise associated with the lower temperature, the large temperature difference between the resonant element and the external environment also allows for extremely stable temperature control, thereby reducing the frequency drift of the resonant element. As a result of reduced phase noise and greater temperature stability, a GPS receiver with a cold resonant element as described herein is capable of acquiring significantly weaker GPS signals. In addition, reduced phase noise allows longer intervals of coherent integration, thereby significantly reducing the processing time (and energy consumption) needed to obtain a fix.

In one embodiment, using a cold resonant element in accordance herewith, signal acquisition is possible at levels between 6-10 dB lower than with a conventional room temperature crystal resonator. In addition, in various embodiments, the average power required to achieve this improvement is less than 100 μW, making the approach described herein appropriate for battery-powered systems.

FIG. 1A schematically depicts one embodiment of a thermoelectric system 100 for cooling (or heating) an object, such as a resonant element 104. In particular, a two-stage thermoelectric system 100 is shown. The first stage includes a first thermoelectric device 108 thermally coupled to (e.g., in physical contact with) the resonant element 104 (e.g., a crystal), while the second stage includes second and third thermoelectric devices 112, 116, each of which is coupled to the first thermoelectric device 108. However, as will be understood by one of ordinary skill in the art, the thermoelectric system 100 may instead include a single stage or, alternatively, three or more stages.

The thermoelectric devices 108, 112, 116 are described herein as thermoelectric coolers, and the thermoelectric system 100 is described herein as a thermoelectric cooling system. However, as will also be understood by one of ordinary skill in the art, and as described more fully below, the thermoelectric devices 108, 112, 116 may instead be employed as thermoelectric heaters such that the thermoelectric system 100 operates as a thermoelectric heating system.

In one embodiment, each stage of the thermoelectric system 100 cools the resonant element 104 to a lesser degree. For example, the first stage (i.e., the first thermoelectric cooler 108) may cool the resonant element 104 to approximately −50° C. below ambient temperature (e.g., to −30° C.), while the second stage (i.e., the second and third thermoelectric coolers 112, 116) may cool the resonant element 104 by another 30° C. to approximately −80° C. below ambient temperature (e.g., to −60° C.).

FIG. 1B is a cross-sectional view of a single thermoelectric cooler in accordance with one embodiment of the invention. In particular, the first thermoelectric cooler 108 is shown in FIG. 1B, although it will be understood that the thermoelectric cooler depicted in FIG. 1B may also represent other thermoelectric coolers, such as the second and third thermoelectric coolers 112, 116. With reference to both FIGS. 1A and 1B, the first thermoelectric cooler 108 includes first and second elongate thermoelectric elements 120, 124 coupled to one another by a conductive interconnect 128. As illustrated, the first and second thermoelectric elements 120, 124 may be partially spaced from one another (e.g., at all points along their lengths L other than where they are coupled together by the interconnect 128) by an insulator 132. The insulator 132 may be, for example, air. Alternatively, the insulator 132 may include, or consist essentially of a polymer or a dielectric material. In addition, each of the first and second thermoelectric elements 120, 124 may include a conductive contact 136 at an end opposite the interconnect 128.

In one embodiment, one of the first and second thermoelectric elements 120, 124 is an n-type semiconductor, while the other is a p-type semiconductor. For example, n- and p-type bismuth telluride ($Bi_2Te_3$), bismuth antimony telluride (BiSbTe), or silicon may be employed. Alternatively, in other embodiments, other types of n- and p-type semiconductors are employed.

In one mode of operation, the first thermoelectric cooler 108 transfers heat away from the resonant element 104 using the Peltier effect. More specifically, by appropriately applying a potential difference (e.g., by connecting a power source, which is not shown) between the conductive contact 136 of each thermoelectric element 120, 124, current may be caused to flow through the n-type element 124, across the interconnect 128, and into the p-type element 120. Electrons in the n-type element 124 will move in a direction opposite to the direction of the current (i.e., away from the interconnect 128 and, thus, the resonant element 104) and holes in the p-type element 120 will move in the same direction as the current (i.e., away from the interconnect 128 and, thus, the resonant element 104), thereby removing heat from the resonant element 104. In practice, this Peltier effect cooling competes with the Joule heating of the semiconductors 120, 124. Thus, the maximum amount of heat that can be stably removed from the resonant element 104 (and, thus, the maximum temperature difference than can be stably maintained between the resonant element 104 and its surrounding environment) is a result of the balance between that Joule heating and the Peltier-effect cooling.

As further illustrated in FIG. 1A, an interconnect 134 of the second thermoelectric cooler 112 may be coupled, through an electrically insulating but thermally conductive material 140 (e.g., ceramic) to the conductive contact 136 of the first thermoelectric cooler's first thermoelectric element 120, while an interconnect 134 of the third thermoelectric cooler 116 may be coupled, through an electrically insulating but thermally conductive material 140 (e.g., ceramic), to the conductive contact 136 of the first thermoelectric cooler's second thermoelectric element 124. In addition, an interconnect 144 may couple an n-type thermoelectric element 148 of the second thermoelectric cooler 112 to a p-type thermoelectric element 152 of the third thermoelectric cooler 116. Then, by appropriately applying a potential difference between conductive contacts 156 and 160, current may be caused to flow through the n-type element 164 of the third thermoelectric cooler 116, across its interconnect 134, through the p-type element 152 of the third thermoelectric cooler 116, across the interconnect 144, through the n-type element 148 of the second thermoelectric cooler 112, across its interconnect 134, and through the p-type element 168 of the second thermoelectric cooler 112, thereby removing heat from the first and second elongate thermoelectric elements 120, 124 of the first thermoelectric cooler 108 via the Peltier effect, as described above. Any number of further stages may likewise be employed to remove additional heat via the Peltier effect.

Alternatively, as will be understood by one of ordinary skill in the art, the thermoelectric devices 108, 112, 116 may also be conveniently used to transfer heat towards the resonant element 104 (such that the thermoelectric system 100 operates as a heating system) by causing current to flow in the direction opposite to that just described (i.e., by reversing the polarity of the potential difference applied between the conductive contact 136 of each thermoelectric element 120, 124, and by reversing the polarity of the potential difference applied between the conductive contacts 156 and 160).

In one embodiment, the maximum temperature difference achievable between the resonant element 104 and the outside environment does not depend on the cross-sectional area of the thermoelectric elements 120, 124 employed in a thermoelectric cooler 108, 112, 116. However, with good thermal insulation (described below) between the thermoelectric cooler 108, 112, 116 and the hotter external environment, the electrical power required to maintain a fixed temperature difference is proportional to that cross-sectional area. Consequently, reducing the cross sectional area of the thermoelectric elements 120, 124 reduces the power required to maintain a fixed temperature difference. In fact, in one embodiment, as described below, having reduced cross section reduces the power required to cool the resonant element 104 to the few hundred micro-watt regime, if run continuously.

Accordingly, in various embodiments, as depicted in FIGS. 1A and 1B, each thermoelectric element 120, 124 employed in a thermoelectric cooler 108, 112, 116 is made long and thin. More specifically, a length L (as illustrated in FIG. 1A) of a thermoelectric element 120, 124 is desirably at least ten times greater than a combined average cross-sectional dimension, orthogonal to the length L, of the first and second thermoelectric elements 120, 124. In other embodiments, the length L of a thermoelectric element 120, 124 is at least 20, 50, 100, 200, 300, or 500 times greater than a combined average cross-sectional dimension, orthogonal to the length L, of the first and second thermoelectric elements 120, 124. As used herein, the "combined average cross-sectional dimension" of the first and second thermoelectric elements 120, 124 does not include, with reference to FIG. 1B, the insulator 132 therebetween. Thus, in order to calculate the combined average cross-sectional dimension of the first and second thermoelectric elements 120, 124, one first locates the first and second thermoelectric elements 120, 124 side-by-side along their length (i.e., with the insulator 132 removed, such that the cross-sections of the first and second thermoelectric elements 120, 124 are adjacent one another, as illustrated in FIG. 1C). One then calculates the combined average cross-sectional dimension of those so located thermoelectric elements 120, 124. For example, with reference to FIG. 1C, one may measure through a center point 172 of those so located thermoelectric elements 120, 124, and in one degree increments through 360 degrees, the combined cross-sectional dimension D. The combined average cross-sectional dimension of those so located thermoelectric elements 120, 124 is then the sum of the 360 measurements divided by 360. Of course, finer or coarser increments for taking the measurements may be employed, so long as the method employed fairly and accurately calculates the combined average cross-sectional dimension. For example, one may instead measure the combined cross-sectional dimension D in half degree increments through 360 degrees and then divide the sum of those measurements by 720 in order to calculate the combined average cross-sectional dimension.

Figure 2:
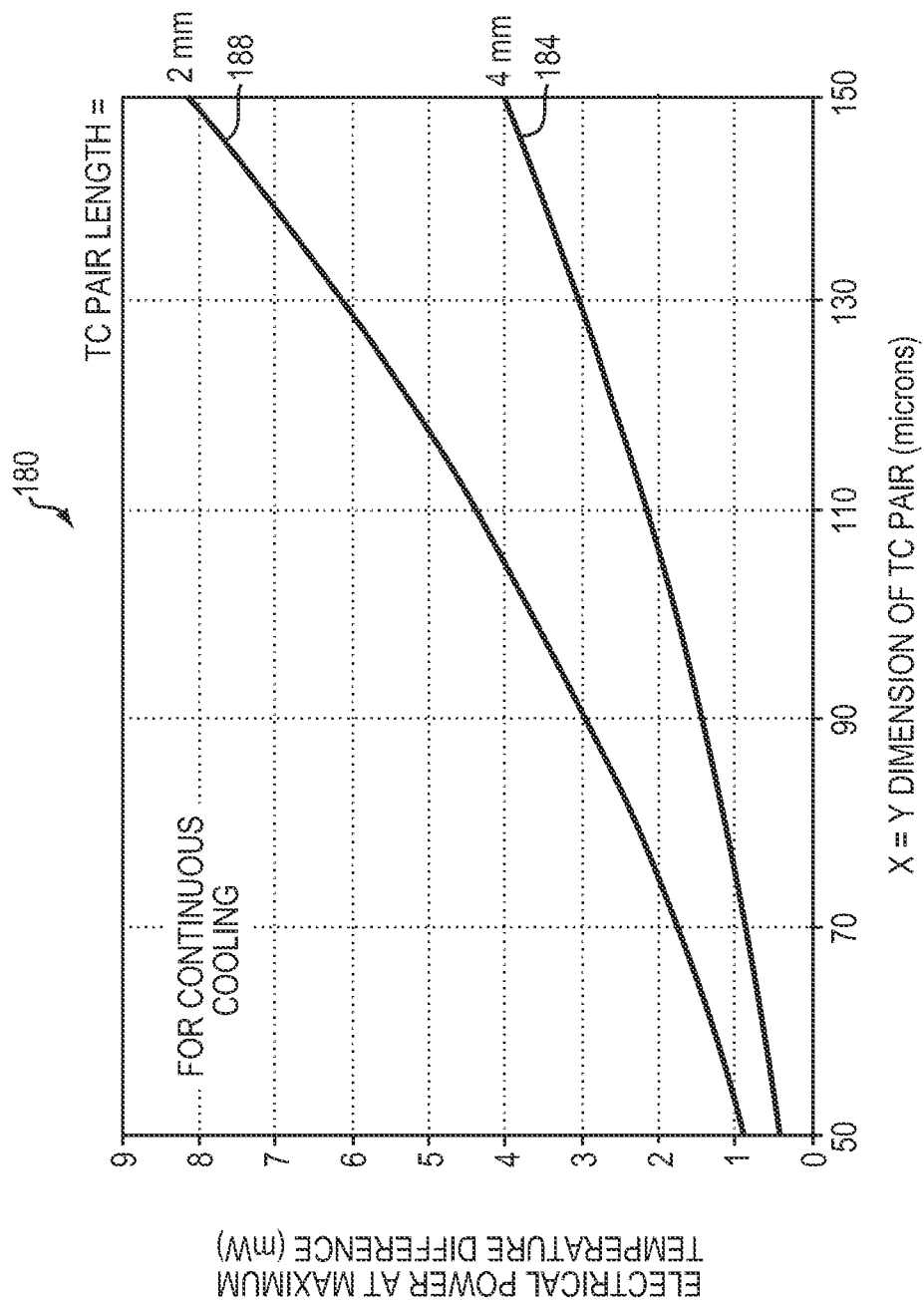
FIG. 2 is a graph illustrating the electrical power required to maintain a maximum temperature difference across a single thermoelectric device for various lengths of the thermoelectric device.
Figure 5:
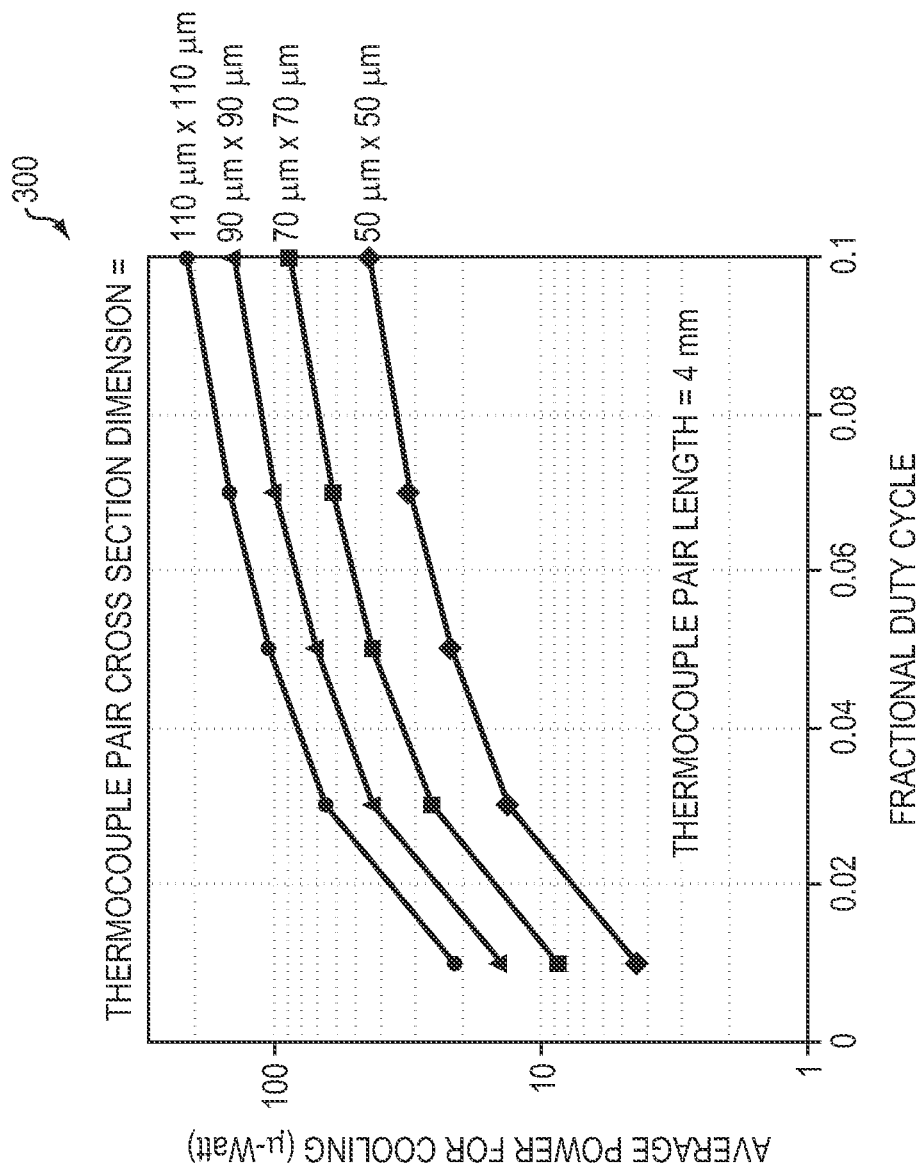
FIG. 5 is a graph illustrating the average electrical power required to maintain a maximum temperature difference across a single thermoelectric device versus duty cycle.

FIG. 2 is a graph 180 depicting the steady-state power requirement for such long and thin thermoelectric coolers 108, 112, 116, as a function of total cross-sectional area. In particular, the thermoelectric cooler 108, 112, 116 is assumed to have a square cross-section, with the dimension of one side shown on the horizontal axis. (This is not necessary, however. The cross-section can have any desired shape, e.g., circular, rectangular, etc.) As the length of the thermoelectric cooler 108, 112, 116 is increased, the electrical power required to maintain the maximum temperature difference across the thermoelectric cooler 108, 112, 116, which is depicted on the vertical axis, decreases (compare line 184, which represents a thermoelectric cooler 108, 112, 116 having a length of 4 mm, to line 188, which represents a thermoelectric cooler 108, 112, 116 having a length of 2 mm). In addition, as also illustrated in the graph 180, as the cross-sectional area of the thermoelectric cooler 108, 112, 116 decreases, the electrical power required to maintain the maximum temperature difference across the thermoelectric cooler 108, 112, 116, also decreases. In the graph 180, the thermoelectric cooler 108, 112, 116 is assumed to run continuously, which, as described below with reference to FIG. 5, is not required in operation.

In an exemplary process for fabricating a thermoelectric cooler 108 having long and thin thermoelectric elements 120, 124, n-type and p-type bismuth telluride wafers are first laminated together. Each of the n-type and p-type wafers may be, for example, 200 microns thick. In addition, the lamination may be accomplished under vacuum at elevated temperature using a specialized adhesive to obtain a substantially defect-free "wafer sandwich" of typically 425 micron thickness. The specialized adhesive may be, for example, an adhesive based on acrylic silicone and/or rubber obtainable from, for example, Rogers Corporation of Rogers. Conn. The wafer sandwich may then be thinned, typically to a total thickness of 200 microns or less, with substantially equal volume of material being removed from the n-type and p-type wafers. In one embodiment, another lamination layer is added to one side of the sandwich, in order to differentiate the n-type side from the p-type side. The wafer sandwich may then be placed on dicing tape and sawed with a conventional semiconductor dicing saw, using specialized conditions (e.g., a low cutting rate, a directed fluid spray, and a sacrificial silicon substrate below wafer sandwich) and choice of cutting blade (e.g., a less than 10 micron size embedded diamond grit on a rigid metal cutting wheel, with a cutting wheel kerf of less than 100 microns). Pairs of thermoelectric elements 120, 124 of, for example, 4 to 6 mm in length may then be removed from the dicing tape, and ohmic metallization may be applied thereto in order to form both the conductive interconnect 128 therebetween and the conductive contacts 136. In one embodiment, the ohmic metallization is deposited through a metal shadow mask aligned to multiple diced pairs of thermoelectric elements 120, 124. More specifically, the aligned mask and thermoelectric elements 120, 124 may be placed in an evacuated sputtering chamber and may be pre-cleaned using inert ion bombardment, typically for 5 to 10 minutes with Argon ions. A series of thin film metal layers may then be sputter-deposited on the surfaces of the n-type and p-type thermoelectric elements 120, 124 exposed by the shadow mask. The mask pattern leads to the formation of individual ohmic contacts 136 at one end of the thermoelectric pair 120, 124 (forming the input terminals of the thermoelectric cooler 108), and a connected ohmic contact 128 at the other end (forming the thermojunction). From the lowest layer up, the first metal layer may be an adhesion-promoting metal such as Ti (typically 75 nm to 150 nm in thickness), followed by a layer of Ni (typically 300 nm to 600 nm in thickness), and a conductive layer of Au (typically 0.5 to 2 microns in thickness). In another embodiment, ohmic contact patterning is done using a photoresist liftoff technique in an evaporator deposition system.

Figure 3:
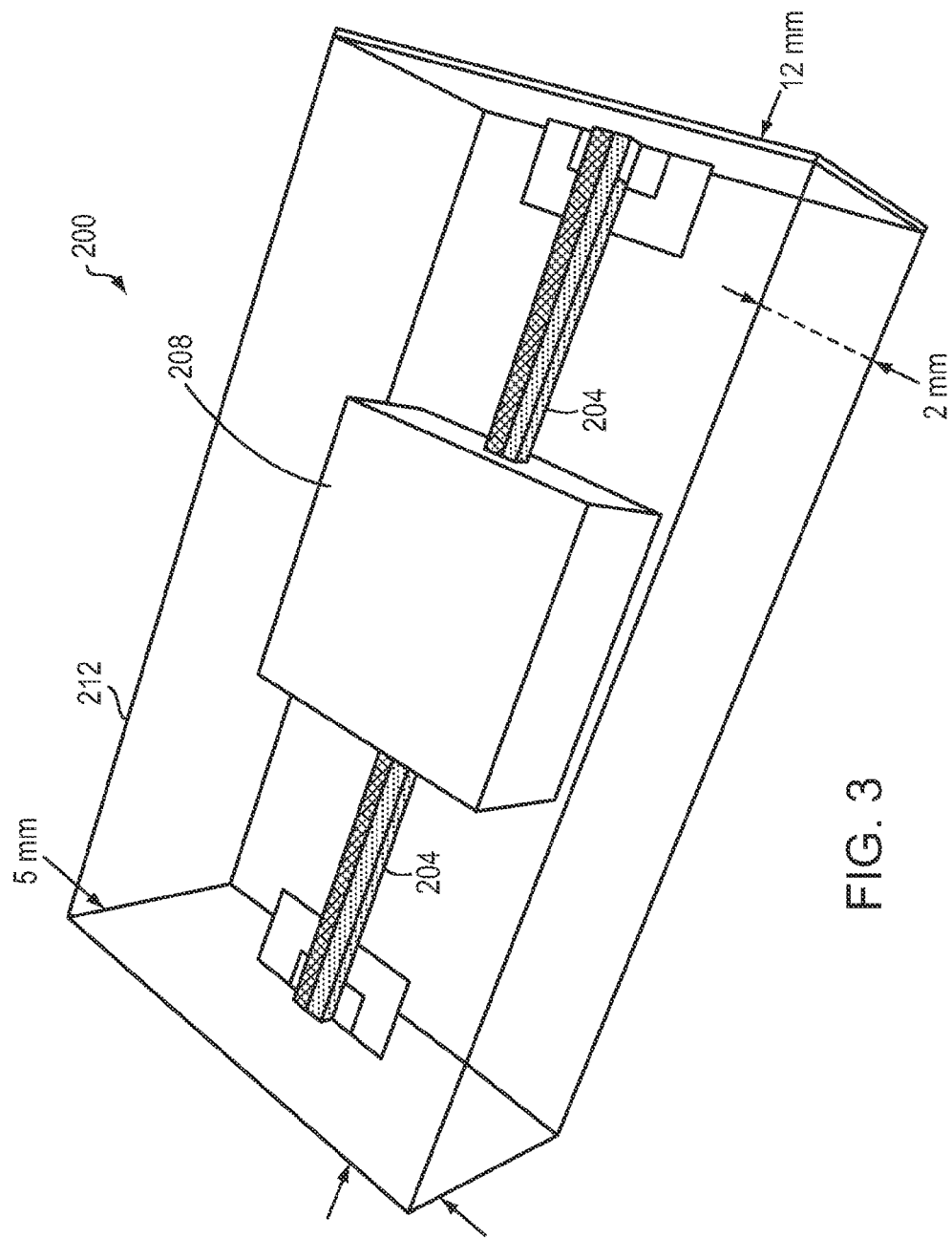
FIG. 3 schematically illustrates a thermoelectric system in accordance with another embodiment of the invention.

FIG. 3 depicts one embodiment of a thermoelectric cooling system 200 that employs the above described thermoelectric coolers to cool a resonant element. In particular, two thermoelectric coolers 204, each with a single stage of cooling, are coupled to (e.g., in direct contact with) a casing 208 that hermetically seals the resonant element. In one embodiment, the resonant element is a crystal oscillator (e.g., a quartz crystal, a sapphire crystal, a rubidium crystal, etc.) that is employed in a local oscillator of a GPS receiver. As before, the two thermoelectric coolers 204 function to remove heat from the casing 208, and, therefore, the resonant element sealed therein, via the Peltier effect. Of course, fewer or more than the two depicted thermoelectric coolers 204 (and/or the single stages thereof) may be employed, depending on the expected heat load and the desired operating temperature of the resonant element.

As illustrated in FIG. 3, a larger housing 212 encloses the thermoelectric coolers 204 and hermetic casing 208. Nevertheless, in order that the thermoelectric cooling system 200 be suitable for portable, small, and low power applications (e.g., for use in handheld and/or battery-powered systems, such as GPS systems), the volume of the larger housing 212 may still be less than 0.5 cubic centimeters. For example, as illustrated in FIG. 3, the housing 212 may have a height of 2 mm, a width of 12 mm, and a depth of 5 mm (i.e., a volume of 0.12 cubic centimeters). Bond wires (not shown), may supply current, as described above, to each thermoelectric cooler 204. In addition, bond wires may be connected from an oscillator circuit (not shown) to the hermetic casing 208 to provide oscillatory voltage at the crystal resonant frequency.

Figure 4:
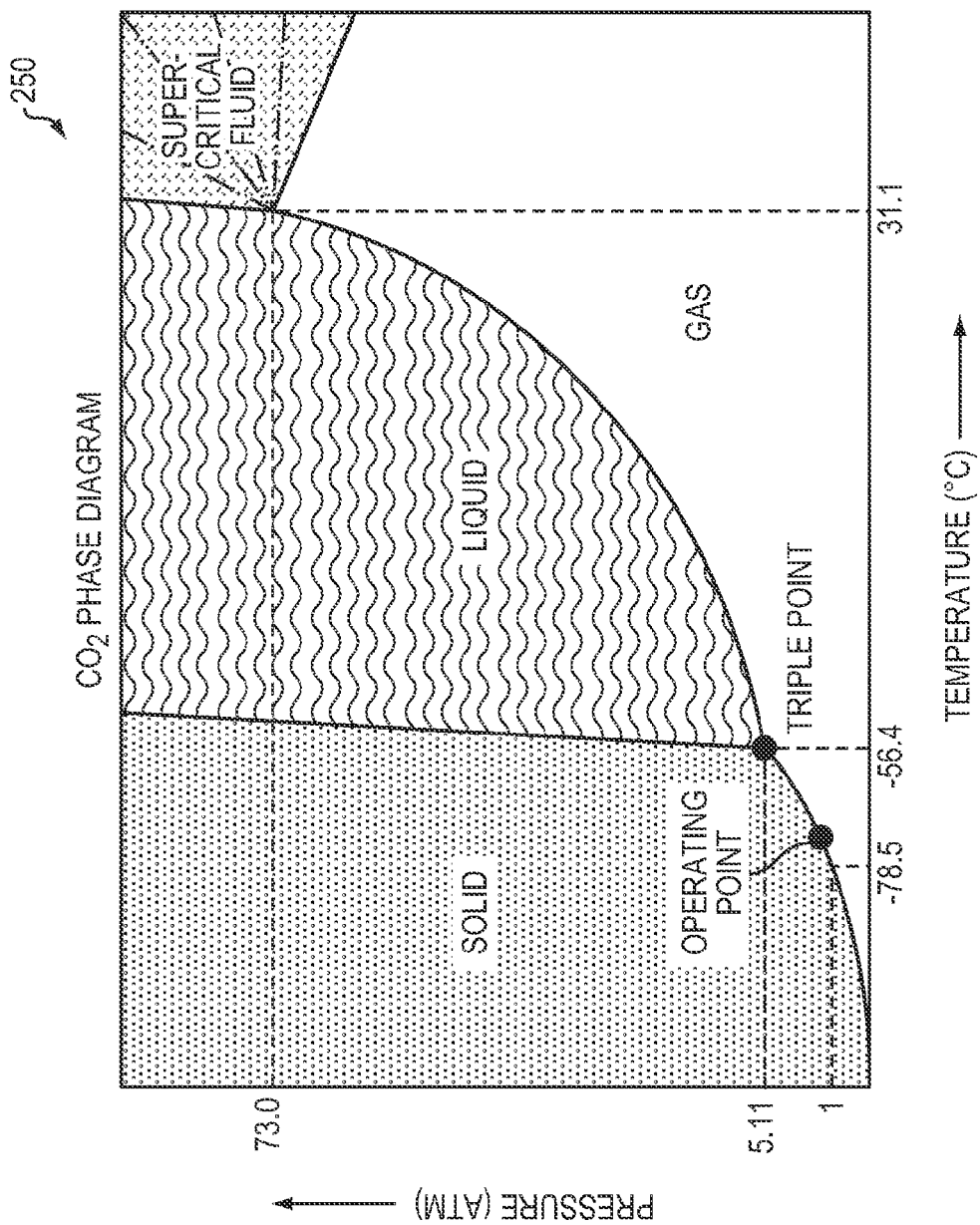
FIG. 4 is a phase diagram for carbon dioxide, which may be employed in an embodiment of a thermoelectric system.

In one embodiment, the housing 212 contains a highly thermally insulating aerogel (manufactured by, for example, Dow Corning Corporation of Midland, Mich., or by 3M Company of St. Paul, Minn.), which minimizes convective heat transfer with the environment surrounding the housing 212. Optionally, the aerogel may also be coated with an infrared reflective layer to minimize radiative loss. In addition to the aerogel, or as an alternative thereto, the housing 212 may be filled with pressurized carbon dioxide. In one embodiment, the carbon dioxide pressure is chosen according to the phase diagram 250 depicted in FIG. 4. More specifically, the temperature and pressure of the carbon dioxide may be chosen to lie on the solid-gas phase change line between −78.5° C. and −56.4° C., at the specified range of corresponding pressures (i.e., between 1 atmosphere and 5.11 atmosphere). By choosing the temperature and pressure of the carbon dioxide to lie on this line segment, the phase change will strongly constrain the temperature of the hermetically sealed resonant element. In particular, the layer of solid carbon dioxide that collects on the hermetic casing 208 would have to sublimate (i.e., convert to gas) entirely before the local temperature could change. Since the hermetic casing 208 is in intimate contact with the solid carbon dioxide, the temperature of the hermetic casing 208 (and, thus, of the resonant element itself) is similarly constrained.

Having good thermal insulation (e.g., through use of the aerogel) between the thermoelectric coolers 204 and the hotter environment external to the housing 212 leads to another benefit: once cooled, the resonant element will tend to remain cold after the electrical power is shut off. Accordingly, where the thermoelectric cooling system 200 is employed in a GPS receiver, the thermoelectric coolers 204 can be turned on (i.e., a potential difference can be applied between the first and second thermoelectric elements 120, 124) and stabilized just prior to using the resonator element of the local oscillator to acquire and decode a GPS signal. The potential difference between the first and second thermoelectric elements 120, 124 may then be removed after the GPS signal is acquired and decoded. In one embodiment, this approach reduces the average power requirement for the thermoelectric cooler 204 to less than 100 μW, making such a system well suited for long term battery powered operation.

FIG. 5 is a graph 300 depicting the operational power requirement (i.e., average electrical power) required to maintain a maximum temperature difference between the hot and cold end of a single thermoelectric cooler 204 versus duty cycle. Operationally, for GPS applications as just mentioned, the thermoelectric cooler 204 is, in one embodiment, turned on just prior to receiving satellite data for determining a fix, and enough time (e.g., a few seconds) is allowed for the thermoelectric cooler 204 and resonant element 104 to reach thermal equilibrium and for the GPS signal to be acquired and decoded before the thermoelectric cooler 204 is again turned off. With, for example, a 2% duty cycle (i.e., a fractional duty cycle, on the horizontal axis of the graph 300, of 0.02), the average power requirement for a thermoelectric cooler 204 having a square cross-section of 70 μm×70 μm will end up in the range of about 10-20 μW.

B. Stabilizing the Oscillation Frequency of a Crystal Resonator

In another embodiment, the resonant element (e.g., a crystal) is not cooled as described above, but, rather, is allowed to assume a range of environmental temperatures expected during its operation so as to very effectively stabilize its oscillation frequency. Generally, in this embodiment, high frequency phase noise persists, but the oscillation frequency of the resonant element is stabilized with much less power than is typically required in conventional systems, such as OCXOs.

Figure 6:
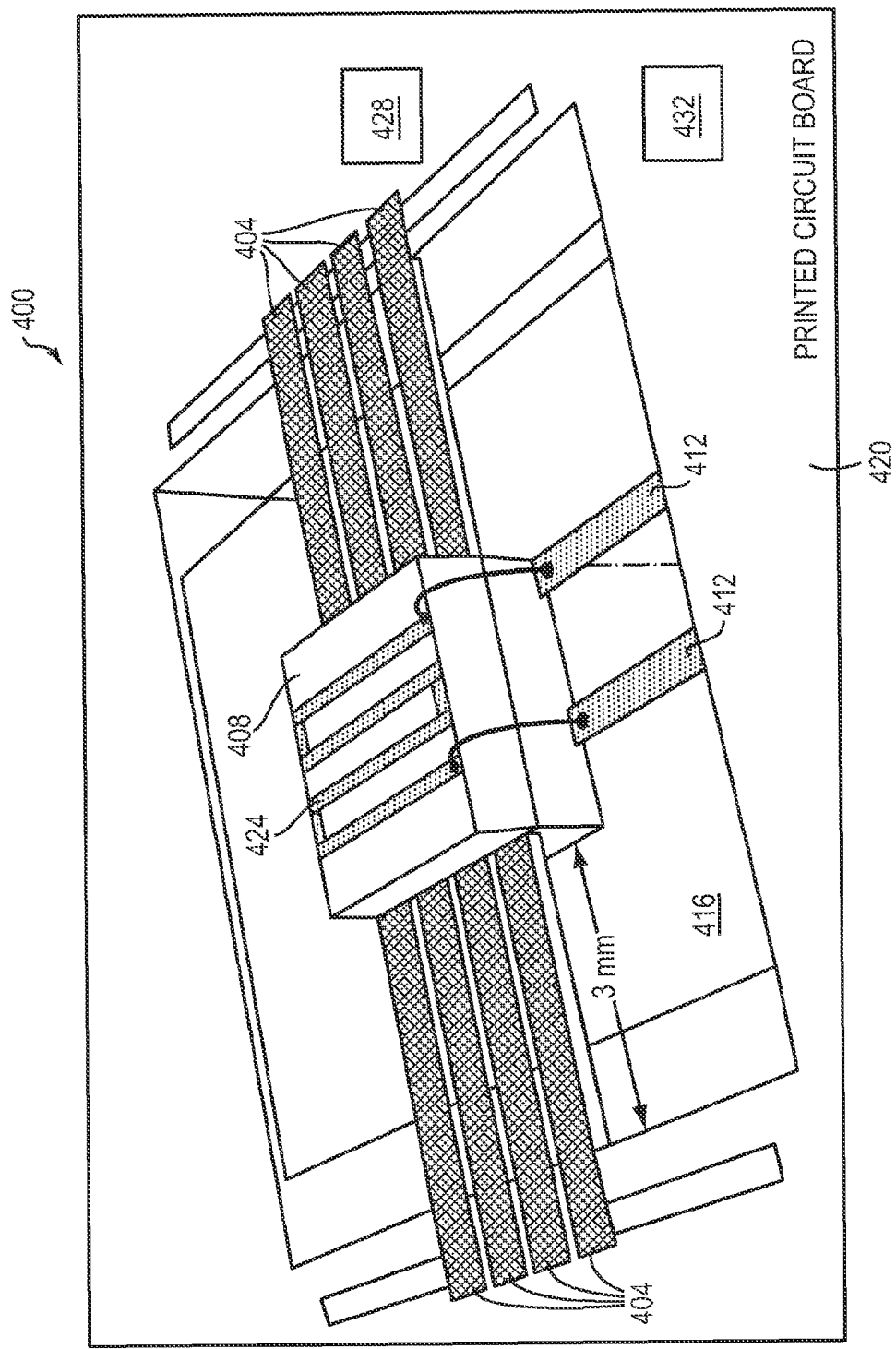
FIG. 6 schematically illustrates a temperature controlled oscillator system in accordance with one embodiment of the invention.

FIG. 6 depicts one embodiment of such a temperature-controlled oscillator system 400. In a similar fashion to the embodiment depicted in FIG. 3, the temperature-controlled oscillator system 400 may include one or more thermoelectric coolers 404, as described above, that are coupled to (e.g., in direct contact with) a casing 408 that hermetically seals a resonant element. In one embodiment, the resonant element is a crystal oscillator (e.g., a quartz crystal, a sapphire crystal, a rubidium crystal, etc.) that is employed in a local oscillator of a GPS receiver. As before, the thermoelectric coolers 404 function to remove heat from the casing 408, and therefore the resonant element sealed therein, via the Peltier effect.

As illustrated in FIG. 6, the hermetic casing 408 may be suspended, for example with Kapton suspensions 412, within an opening 416 in a standard printed circuit board 420. Moreover, a resistive heater 424 may be deposited and patterned on one or more surfaces of the casing 408 (e.g., a top surface, as shown). The resistive heater 424 may include, or consist essentially of, nichrome or other materials. By coupling both the thermoelectric coolers 404 and the heater 424 to the same, single casing 408, the need for a "dual-oven" approach (i.e., a first casing having the thermoelectric coolers 404 coupled thereto, and a second, separate casing (either inside or surrounding the first casing) having the heater 424 coupled thereto) may be avoided. Advantageously, the single casing 408 approach is smaller in size that the dual-oven approach, is less costly, and also consumes less power. Alternatively, in another embodiment, a thermoelectric device 404 may be employed to both cool the casing 408 and, by reversing the flow of current therein (as described above), to add heat to the same, single casing 408.

In one embodiment, the hermetically packaged crystal temperature is maintained by a combination of the cooling and heating elements 404, 424. More specifically, in one embodiment, the temperature-controlled oscillator system 400 further includes a temperature sensor 428 for measuring an ambient temperature, and a microprocessor 432 for controlling the cooling and heating elements 404, 424 based on the measured temperature. The temperature sensor 428 may be, for example, a standard off-the-shelf temperature sensor, such as a thermistor or thermocouple, while the microprocessor 432 may be a general-purpose microprocessor (e.g., any of the PENTIUM microprocessors supplied by Intel Corporation) programmed using any suitable programming language or languages (e.g., C, C++, C#, Java, Visual Basic, LISP, BASIC, PERL, etc.).

The microprocessor 432 may be, for example, in electrical communication with the temperature sensor 428 and may supply current to activate, as appropriate, each of the cooling and heating elements 404, 424. In particular, the microprocessor 432 may be programmed to maintain the temperature of the crystal oscillator at a set temperature chosen to be within the vicinity of the expected ambient temperature. For example, if the temperature-controlled oscillator system 400 is expected to be operated in a room-temperature environment, the microprocessor 432 may be programmed to maintain the temperature of the crystal oscillator at a set temperature of 22° C. Then, following a measurement of the ambient temperature by the sensor 428, the microprocessor 432 may activate the heating element 424 and cause the crystal oscillator to be heated if the measured ambient temperature is below the set temperature threshold (e.g., is 21.9° C. or cooler), or, alternatively, may activate the cooling element 404 and cause the crystal oscillator to be cooled if the measured ambient temperature is above the set temperature threshold (e.g., is 22.1° C. or warmer). In one embodiment, the cooling and heating elements 404, 424 are both operated simultaneously at very low power when the ambient temperature is approximately equal to the set temperature threshold in order to stringently maintain the crystal oscillator's temperature. This simultaneous operation of the cooling and heating elements 404, 424 can avoid, for example, control range instabilities that may occur because of turn-on transients in the either or both the cooling and/or heating elements 404, 424. One advantage, then, of operating separate cooling and heating elements 404, 424 is that it generally allows for more precise temperature control, particularly in environments where the heat transfer rate to the environment changes rapidly (e.g., in the presence of wind gusts, intermittent rain or sunlight exposure, etc.). As mentioned, in other embodiments, a single thermoelectric element may be employed to accomplish both cooling and heating. While such an embodiment docs not feature as precise a temperature control as operating separate cooling and heating elements 404, 424, it may nevertheless be sufficient to maintain temperature range control in certain instances.

Figure 7:
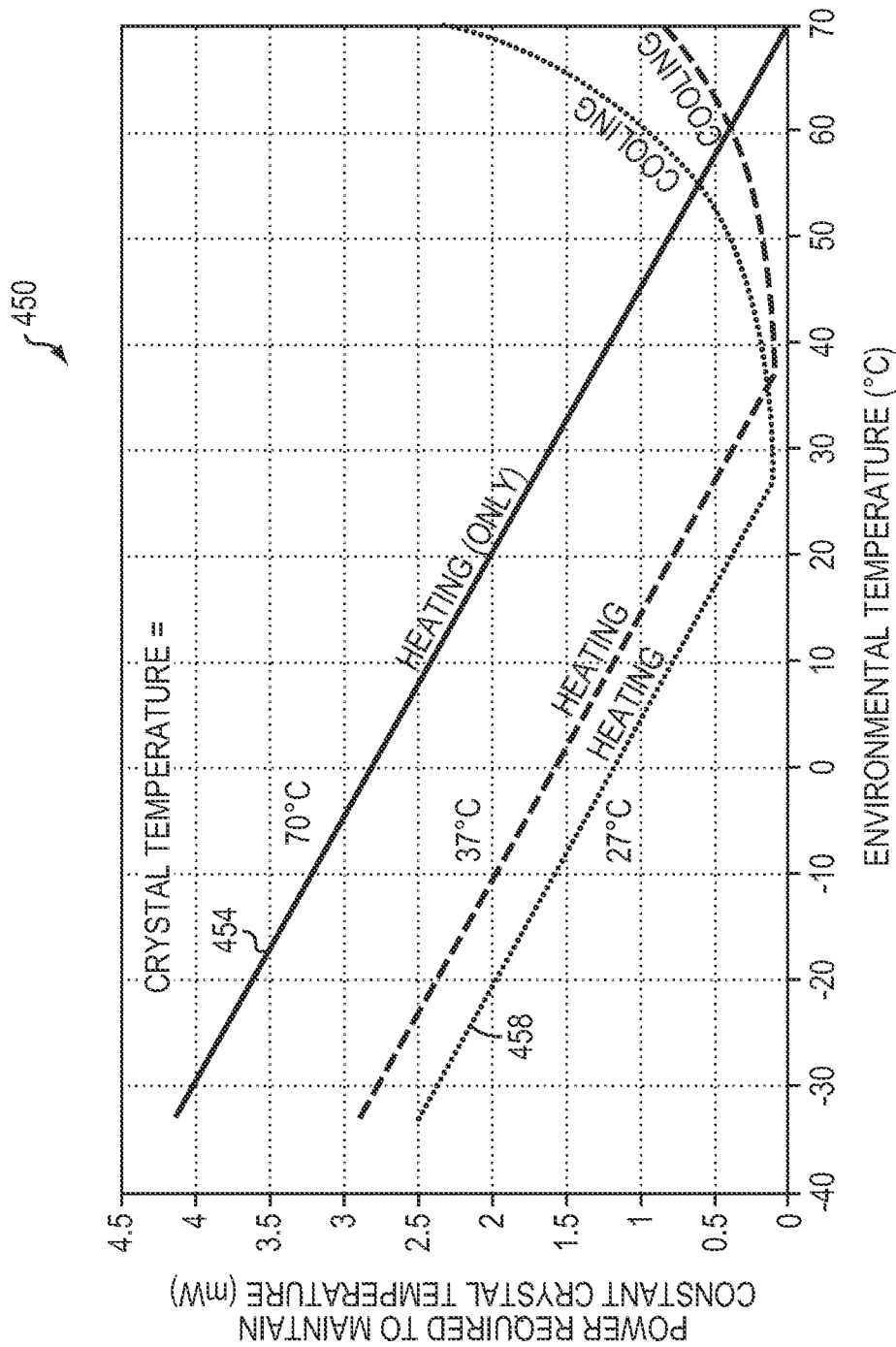
FIG. 7 is a graph comparing the electrical power required to operate the temperature-controlled oscillator system of FIG. 6 to the electrical power required to operate a conventional OCXO, as a function of environmental temperature.

FIG. 7 is a graph 450 comparing the electrical power required to operate the temperature-controlled oscillator system 400 to the electrical power required to operate a conventional OCXO, as a function of environmental temperature. In a conventional OCXO employing only a heater, as described above, the crystal temperature might be set to 70° C. (as illustrated by the line 454 labeled 70° C. in FIG. 7). In such a case, when the environmental temperature is around room temperature, the conventional OCXO uses about 2 mW of power continuously to maintain the higher crystal temperature. On the other hand, when the crystal temperature is instead set at 27° C. using the temperature-controlled oscillator system 400 described herein (as illustrated by the line 458 labeled 27° C. in FIG. 7), the power required around room temperature is in the range of 0.1 mW, which is less than 5% of the power that would otherwise be required with the conventional OCXO.

Figure 8:
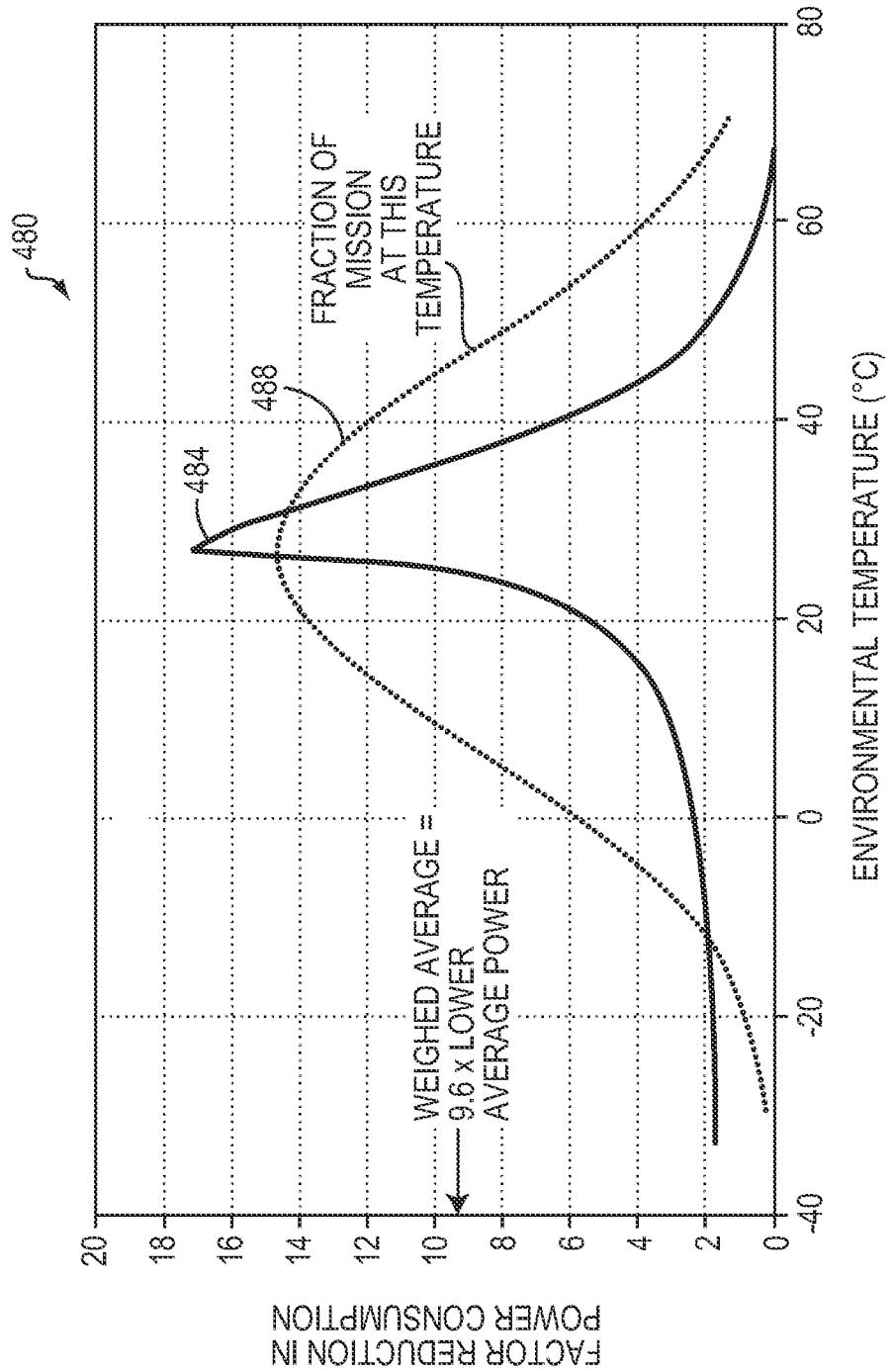
FIG. 8 is a graph illustrating the factor of reduction in power consumption of the temperature-controlled oscillator system of FIG. 6 in comparison to a conventional OCXO, as a function of the environmental temperature.

FIG. 8 is a graph 480 that further quantifies the advantage of the temperature-controlled oscillator system 400 by showing, with line 484, the factor of reduction in power consumption of the temperature-controlled oscillator system 400 in comparison to a conventional OCXO, as a function of the environment temperature. If the distribution of environmental temperature over an entire mission is assumed to be that shown with the broken line 488, the total energy required to operate the temperature-controlled oscillator system 400, as compared to a conventional OCXO, is reduced by an average factor of 9.6.

Accordingly, the low-power thermoelectric coolers 404 permit practical operation of the temperature-controlled oscillator system 400 around room temperature (i.e., around the most likely environmental temperature). The reduced temperature of the crystal oscillator, combined with the use of the low-power thermoelectric coolers 404, advantageously reduces the continuous power requirement typically associated with conventional OCXOs. Consequently, OCXO-like frequency stability performance can be obtained at far lower power levels than has been accomplished in the past for miniature OCXOs, making the temperature-controlled oscillator system 400 appropriate for small battery powered electronics, such as a GPS receiver.

Having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A temperature-controlled oscillator system, comprising:
a crystal oscillator;
a casing sealing the crystal oscillator;
a heater coupled to the casing for heating the crystal oscillator when an ambient temperature is below a set temperature threshold; and
a cooler, separate from the heater, coupled to the casing for cooling the crystal oscillator when the ambient temperature is above the set temperature threshold.

2. The temperature-controlled oscillator system of claim 1, wherein both the heater and the cooler operate when the ambient temperature is approximately equal to the set temperature threshold.

3. The temperature-controlled oscillator system of claim 1, wherein the heater comprises a resistive heater.

4. The temperature-controlled oscillator system of claim 1, wherein the cooler comprises a thermoelectric cooler.

5. The temperature-controlled oscillator system of claim 4, wherein the thermoelectric cooler comprises first and second elongate thermoelectric elements coupled to one another for transferring heat away from the crystal oscillator using the Peltier effect, a length of at least one of the thermoelectric elements being at least ten times greater than a combined average cross-sectional dimension, orthogonal to the length, of the first and second thermoelectric elements when located side-by-side along their length.

6. The temperature-controlled oscillator system of claim 1 further comprising a temperature sensor for measuring the ambient temperature.

7. A method for controlling a temperature of a crystal oscillator sealed within a casing, the method comprising:
measuring an ambient temperature;
heating the casing, and thereby the crystal oscillator, with a heater coupled to the casing when the ambient temperature is below a set temperature threshold; and
cooling the casing, and thereby the crystal oscillator, with a cooler coupled to the casing separately from the heater when the ambient temperature is above the set temperature threshold.

8. The method of claim 7 further comprising both heating and cooling the casing, and thereby the crystal oscillator, when the ambient temperature is approximately equal to the set temperature threshold.

9. The method of claim 7, wherein the cooler is a thermoelectric cooler and wherein cooling the casing comprises transferring, using the Peltier effect, heat away from the casing via the thermoelectric cooler.

10. The method of claim 9, wherein the thermoelectric cooler comprises first and second elongate thermoelectric elements coupled to one another and to the casing, a length of at least one of the thermoelectric elements being at least ten times greater than a combined average cross-sectional dimension, orthogonal to the length, of the first and second thermoelectric elements when located side-by-side along their length.

* * * * *